Figure 1:
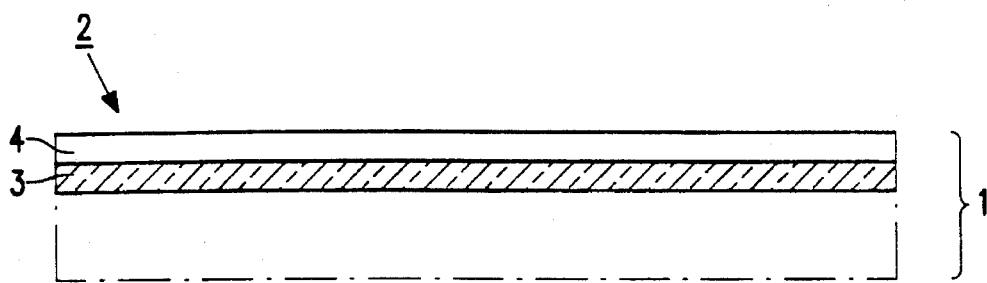
Figure 2:
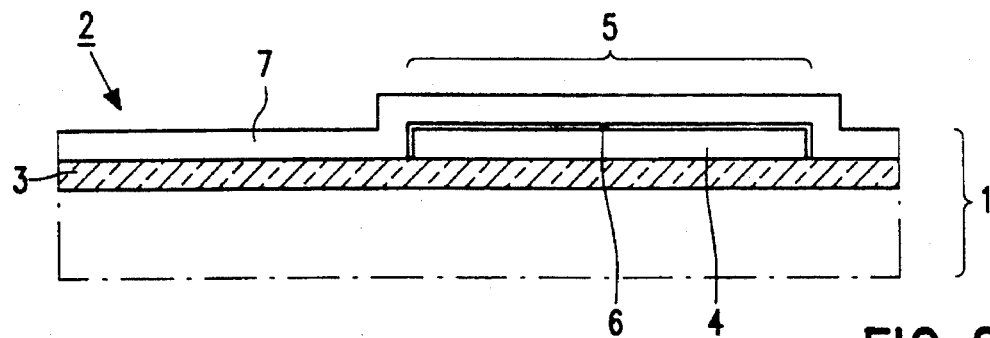
Figure 3:
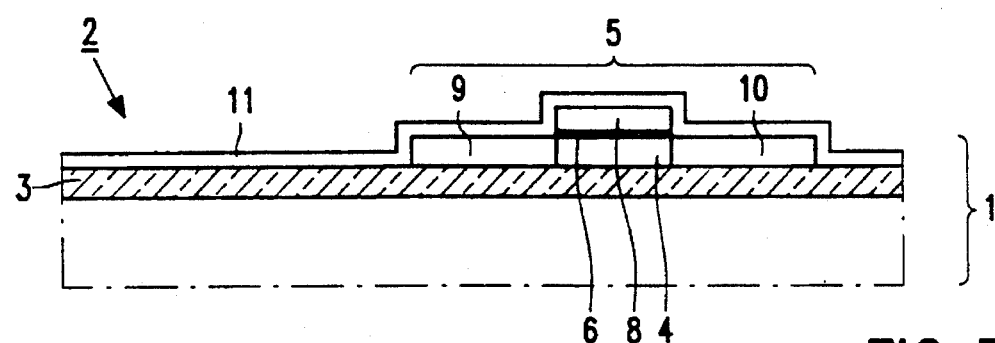
Figure 4:
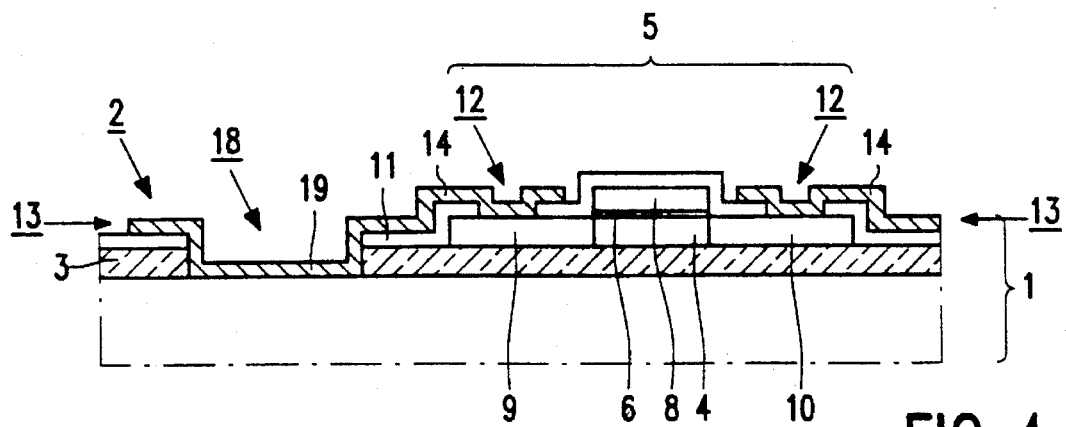
Figure 5:
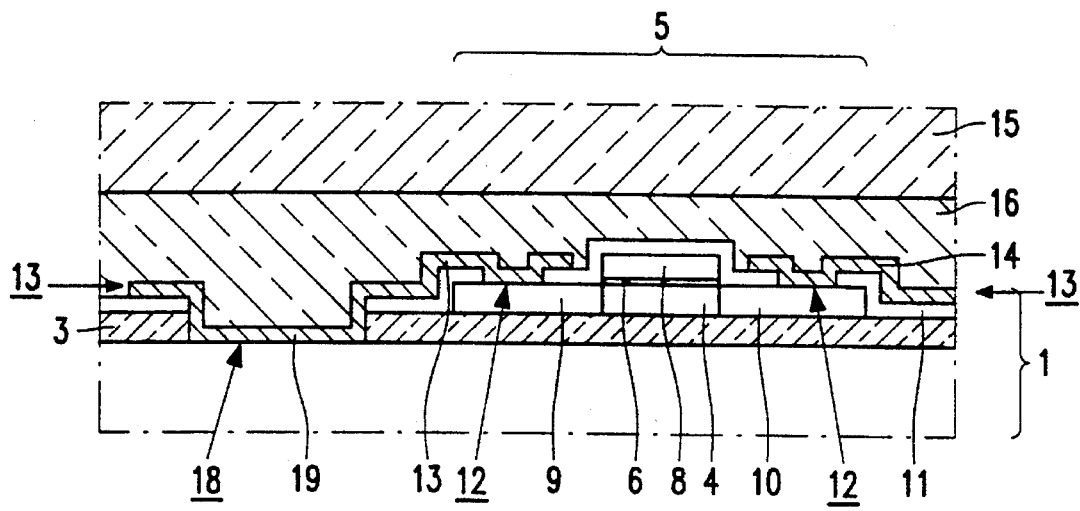
Figure 6:
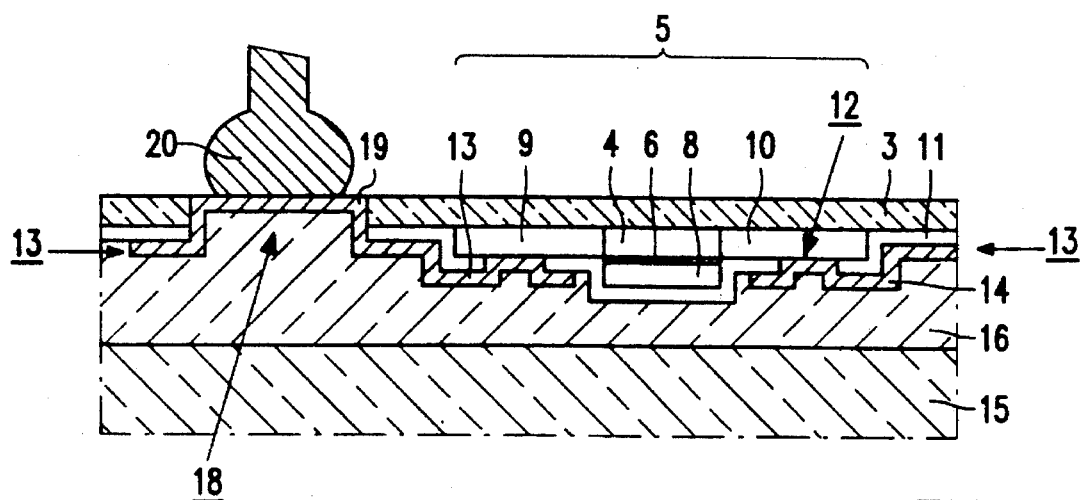

United States Patent [19]

Dekker et al.

[11] Patent Number: 5,504,036
[45] Date of Patent: Apr. 2, 1996

[54] METHOD OF MANUFACTURING SEMICONDUCTOR DEVICES WITH SEMICONDUCTOR ELEMENTS FORMED IN A LAYER OF SEMICONDUCTOR MATERIAL PROVIDED ON A SUPPORT SLICE

[75] Inventors: Ronald Dekker; Henricus G. R. Maas; Wilhelmus T. A. J. van den Einden, all of Eindhoven, Netherlands

[73] Assignee: U.S. Philips Corporation, New York, N.Y.

[21] Appl. No.: 447,597

[22] Filed: May 23, 1995

[30] Foreign Application Priority Data

May 24, 1994 [BE] Belgium ............................. 09400527

[51] Int. Cl.$^6$ .................................................. H01L 21/44
[52] U.S. Cl. ........................ 437/183; 437/187; 437/974; 148/DIG. 12
[58] Field of Search ..................................... 437/226, 183, 437/187, 474, 901, 921; 216/2; 148/DIG. 12

[56] References Cited

U.S. PATENT DOCUMENTS

| | | | |
|---|---|---|---|
| 4,532,003 | 7/1985 | Beasom | 437/974 |
| 4,596,069 | 6/1986 | Bayraktaroglu | 29/571 |
| 5,081,061 | 1/1992 | Rouse et al. | 437/974 |
| 5,091,330 | 2/1992 | Cambou et al. | 148/DIG. 12 |

FOREIGN PATENT DOCUMENTS 118248  1/1989  Japan.

*Primary Examiner*—George Fourson
*Assistant Examiner*—Thomas G. Bilodeau
*Attorney, Agent, or Firm*—Paul R. Miller

[57] ABSTRACT

A method is provided of manufacturing a semiconductor device whereby semiconductor elements (5) and conductor tracks (14) are formed on a first side (2) of a semiconductor slice (1) which is provided with a layer of semiconductor material (4) disposed on an insulating layer (3). Then the semiconductor slice (1) is fastened with said first side (2) to a support slice (15), after which material is removed from the semiconductor slice (1) from the other, second side (17) until the insulating layer (3) has become exposed. The insulating layer (3) is provided with contact windows (18) in which conductive elements (19) are provided. This is done from the first side (2) of the semiconductor slice (1) before the latter is fastened to the support slice (15). The semiconductor elements (5) are externally contacted with a contact wire (20) via the conductive elements (19). The contact windows (18) and the conductive elements (19) may be formed during process steps which are carried out for manufacturing the semiconductor elements.

6 Claims, 3 Drawing Sheets

METHOD OF MANUFACTURING SEMICONDUCTOR DEVICES WITH SEMICONDUCTOR ELEMENTS FORMED IN A LAYER OF SEMICONDUCTOR MATERIAL PROVIDED ON A SUPPORT SLICE

The invention relates to a method of manufacturing semiconductor devices whereby semiconductor elements and conductor tracks are formed on a first side of a semiconductor slice provided with a layer of semiconductor material lying on an insulating layer, after which the semiconductor slice is fastened with this first side to a support slice, and after which material is removed from the semiconductor slice from the other, second side until the insulating layer has been exposed, during which method the insulating layer is provided with contact windows in which conductive elements are provided which are connected to the semiconductor elements.

The support slice may be divided into separate parts in usual manner, for example by sawing, so as to form individual semiconductor devices which may comprise one or several semiconductor elements. In the former case discrete semiconductor devices are obtained, in the latter case integrated semiconductor devices. The semiconductor elements may be, for example, bipolar transistors or field effect transistors.

Since the semiconductor slice need not be heated any more to temperatures above approximately 200° C. after the formation of the semiconductor elements, no extreme demands need be imposed on the fastening of the semiconductor slice to the support slice and on the support slice itself. The semiconductor slice may be fastened to a conductive support slice made, for example, of a metal such as copper, or to an insulating support slice made, for example, of an insulator such as glass or alumina, by means of a synthetic resin glue such as an epoxy or acrylate glue. The support slice may have a coefficient of expansion which is different from that of the material of the semiconductor slice. Differences in expansion will be small during subsequent process steps and can then be accommodated by the glue layer.

The layer of semiconductor material, for example made of silicon, may be monocrystalline, but also polycrystalline or amorphous. The insulating layer, for example made of silicon oxide, may be provided by deposition, but also in some other way. A layer of silicon oxide may be obtained, for example, through implantation of oxygen ions into a silicon slice.

The insulating layer on which the layer of semiconductor material is provided may, during the bulk-reducing treatment in which the insulating layer is exposed, serve as a layer on which this bulk reduction stops automatically; as an etching stopper layer during an etching treatment or as a polishing stopper layer during a polishing treatment. The insulating layer itself is not removed and serves subsequently as an insulation for the semiconductor elements. The insulating layer is provided with contact windows in which conductive elements are provided which are connected to the semiconductor elements. The semiconductor elements may then be contacted externally through these conductive elements.

BACKGROUND OF THE INVENTION

The English Abstract of JP-A-1/18248 discloses a method of the kind mentioned in the opening paragraph whereby the insulating layer is provided with contact windows and whereby the conductive elements in the contact windows are provided after the insulating layer has been exposed by the bulk-reducing treatment.

As is usual, a photoresist mask is to be provided on the insulating layer in order to form the contact windows in the insulating layer. A photoresist layer is thus provided on the exposed insulating layer, after which a photoresist mask is imaged. A disadvantage of the known method is that it is not possible during this photolithographic process to use alignment marks provided on the first side of the semiconductor slice during the provision of the semiconductor element and the conductor tracks on this side. A photoresist mask should also be provided for the provision of the conductive elements in the contact windows, for which said alignment marks cannot be used either.

Furthermore, equipment other than that used for forming the semiconductor elements and the conductor tracks on the semiconductor slice will be found to be necessary for providing the contact windows and the conductive elements. The support slice on which the semiconductor elements and the conductor tracks and the insulating layer are fastened has, for example, a different thickness from that of the semiconductor slice.

SUMMARY OF THE INVENTION

The invention has for its object to provide a method which renders it possible to use the same photolithographic equipment and the same alignment marks on the first side of the semiconductor slice, which are used for forming the semiconductor elements and the conductor tracks on the first side of the semiconductor slice, also for forming the contact windows in the insulating layer and for forming the conductive elements.

The method mentioned in the opening paragraph is for this purpose characterized in that the insulating layer is provided with contact windows and the conductive elements are provided in the contact windows from the first side of the semiconductor slice before the latter is fastened to the support slice.

The same semiconductor slice is processed at its same first side as during the formation of the semiconductor elements and the conductor tracks also for the provision of the contact windows in the insulating layer and for providing the conductive elements. The same lithographic equipment and the same alignment marks may be used for this. The invention is based on the recognition that the conductive elements which are provided in the contact windows before the semiconductor slice is fastened on the support slice will be exposed during the bulk-reducing treatment in which the insulating layer is exposed. The conductive elements thus exposed will then render possible the external contacting of the semiconductor elements.

In practice, all process steps preceding the fastening of the semiconductor slice on the support slice can be carried out in a different space from the space in which the remaining process steps are carried out. The former steps must be carried out in a clean room, the other ones may be carried out outside it in a space in which the absence of dust particles is subject to less stringent requirements. Since such a space is much cheaper than a clean room, the method according to the invention can be carried out at a comparatively low cost.

The conductor tracks and the conductive elements may be formed in a single photolithographic step if after the formation of the contact windows in the insulating layer a conductive layer is deposited on the first side of the semiconductor slice, in which subsequently both the conductor tracks and the conductive elements are formed.

Preferably, the conductive layer is deposited on a conductive base layer after which the conductor tracks and the conductive elements are formed both in the conductive layer and in the base layer. The materials of the base layer and of the conductive layer may then be chosen such that the conductive layer is satisfactorily protected by the base layer during the process of exposing the insulating layer, while in addition the conductor tracks have a comparatively low electrical resistance. If a semiconductor slice made of silicon is used with an insulating layer of silicon oxide on which a silicon layer of semiconductor material is provided, then silicon is removed during the process of exposing the insulating layer. This bulk-reducing treatment must then stop when the silicon oxide insulating layer is reached. This may be done in usual manner, for example, highly selectively in an etching bath containing KOH. In that case, the conductive layer may be very effectively protected by a base layer of titanium, tungsten, or a titanium-tungsten alloy. The provision of, for example, a layer of aluminium or of an aluminium alloy on the base layer renders it possible to form conductor tracks with an electrical resistance which is much lower than that of conductor tracks formed in a layer of titanium, tungsten, or a titanium-tungsten alloy.

The contact windows may also be provided with an auxiliary layer on their bottom before the conductive layer is deposited. The conductive layer is then protected by this auxiliary layer during the process of exposing the insulating layer. With the use of the same semiconductor slice as above, the auxiliary layer may be made from titanium, tungsten, or a titanium-tungsten alloy. Alternatively, however, the auxiliary layer may now be manufactured from a non-conductive material as well. In the example given here it is possible, for example, to use silicon nitride which acts as a very effective etching stopper during etching in a bath containing KOH. During or after the bulk-reducing treatment, however, it is then necessary to expose the conductive layer within the contact window.

The conductive layer is exposed not only when the auxiliary layer is made of an insulating material, but preferably also when this auxiliary layer is made of a conductive material, and also in the case in which the conductive layer is provided on a conductive base layer. In all these cases it is possible then to manufacture the conductive layer from a material, such as aluminium or an aluminium alloy, on which a conductive wire can be provided by means of a usual bonding technique for external contacting.

BRIEF DESCRIPTION OF THE DRAWING FIGURES

The invention will be explained in more detail below, by way of example, with reference to a drawing, in which FIGS. 1,2,3,4,5,and 6 diagrammatically and in cross-section show a portion of a semiconductor device in a number of stages of manufacture by the method according to the invention, and FIGS. 7,8,9, and 10 diagrammatically and in cross-section show a portion of a semiconductor device during a few stages of manufacture by means of preferred embodiments of the method according to the invention.

DESCRIPTION OF THE INVENTION

FIGS. 1 to 6 diagrammatically and in cross-section show a portion of a semiconductor device in a few stages of manufacture by the method according to the invention. Manufacture starts with an approximately 700 µm thick semiconductor slice 1 which is provided at its first side 2 with a layer of semiconductor material 4 disposed on an insulating layer 3. In this example, a semiconductor slice 1 of monocrystalline silicon is used in which an approximately 0.4 µm thick layer of silicon oxide 3 is provided through implantation of oxygen ions. On the silicon oxide layer 3 there is an approximately 0.1 µm thick layer of semiconductor material, made of monocrystalline silicon 4. This, however, is immaterial to the invention. The semiconductor layer may alternatively be a layer of polycrystalline or amorphous semiconductor material, which may be a semiconductor material other than silicon. The insulating layer may also be manufactured from materials other than silicon oxide.

Semiconductor elements are formed in usual manner on the first side 2. These may be various elements such as field effect transistors and bipolar transistors. In the present example, the provision of a single element in the form of a field effect transistor is shown for the sake of clarity. The silicon layer 4 is for this purpose provided with a p-type doping in usual manner and subsequently subdivided into mutually insulated islands 5, in this example in that the silicon layer 4 is etched away from the insulating layer 3 between the islands 5. A field effect transistor is formed in each of these islands. The silicon layer 4 is for this purpose provided with a gate dielectric layer 6, after which the silicon layer 4 is subjected to a usual thermal oxidation. Then a layer of polycrystalline silicon 7 is deposited, in which a gate electrode 8 is formed. With the gate electrode 8 acting as a mask, source 9 and drain 10 are subsequently formed through implantation of an n-type dopant. Finally, the transistor thus formed is covered with an insulating silicon oxide layer 11.

Contact windows 12 are provided in the silicon oxide layer 11, after which conductor tracks 14 are formed in a conductive layer 13 in usual manner on the first side 2 of the semiconductor slice 1.

After the conductor tracks 14 have been formed, the semiconductor slice 1 is fastened with its first side 2 to a support slice 15. In this example, the semiconductor slice 1 is fastened to an approximately 1.5 mm thick glass support slice 15 by means of a layer of acrylate glue 16. The semiconductor slice 1 need not be heated to temperatures above approximately 200° C. any more after the formation of the conductor tracks 14, which is why the fastening of the semiconductor slice 1 to the support slice 15 and the support slice 15 itself are not subject to extreme requirements. The semiconductor slice 1 may be fastened to the support slice 15, for example, with a synthetic resin glue such as an epoxy glue or, as in the present example, an acrylate glue. The support plate 15 in the example is made of glass, but altenatively a metal support plate, for example made of copper, or an alternative insulator, for example aluminium oxide, are also possible. In general, the support slice is allowed to have a coefficient of expansion which is different from that of the semiconductor slice material. Differences in expansion will be small during subsequent process steps and may then be accommodated by the glue layer.

After the semiconductor slice 1 has been fastened to the support slice 15, material is removed from the semiconductor slice from the other, second side 17 until the insulating layer 3 is exposed. For this purpose, the second side 17 is first exposed to a usual chemical-mechanical polishing treatment until the insulating layer of silicon oxide 3 is no more than a few µm away, upon which this layer 3 is exposed in an etching bath containing KOH. The etching treatment stops automatically the moment the layer 3 is reached, this layer acting as an etching stopper layer.

The silicon oxide insulating layer 3 is provided with contact windows 18 in which conductive elements 19 are provided which are connected to the semiconductor elements, in the drawing to the source 9 of the transistor. The contact windows 18 and the conductive elements 19 are formed, according to the invention, from the first side 2 of the semiconductor slice 1 before the latter is fastened to the support slice 15. In the present example, the contact windows 18 are formed in the insulating silicon oxide layer 3 during the same photolithographic process step in which the contact windows 12 are also formed in the silicon oxide layer 11. Accordingly, the same alignment marks (not shown) used for forming the contact windows 12 may also be used for forming the contact windows 18. The conductor tracks 14 and the conductive elements 19 in this example are formed in one and the same conductive layer 13. The conductor tracks 14 and the conductive elements 19 may then be formed in usual manner in one and the same photolithographic process step. The alignment marks used for forming the contact windows 12 and 18 may also be used for this purpose.

After the insulating silicon oxide layer 3 has been exposed from the second side 17 of the semiconductor slice 1, the conductive elements 19 provided in the contact windows 18 will also have been exposed. The semiconductor elements, in the example the field effect transistor, may then be contacted by means of these exposed conductive elements 19. This has been effected in the example by means of a contact wire 20 provided by means of a usual bonding technique. It is alternatively possible to provide an external contact on the exposed conductive elements 18 by electroplating.

To provide such external contact wires 20, the support slice is divided into individual parts in usual manner, for example by sawing, whereby separate semiconductor devices are formed. These may comprise one or several semiconductor elements each. In the former case discrete semiconductor devices are obtained, in the latter case integrated semiconductor devices.

All process steps preceding the fastening of the semiconductor slice 1 on the support slice 15 may be carried out in a space different from the space in which the remaining process steps are carried out. The former steps are carried out in a clean room, the other ones in a room in which the absence of dust particles is subject to less stringent requirements. As a result, the method according to the invention can be carried out at a comparatively low cost.

Figure 7:
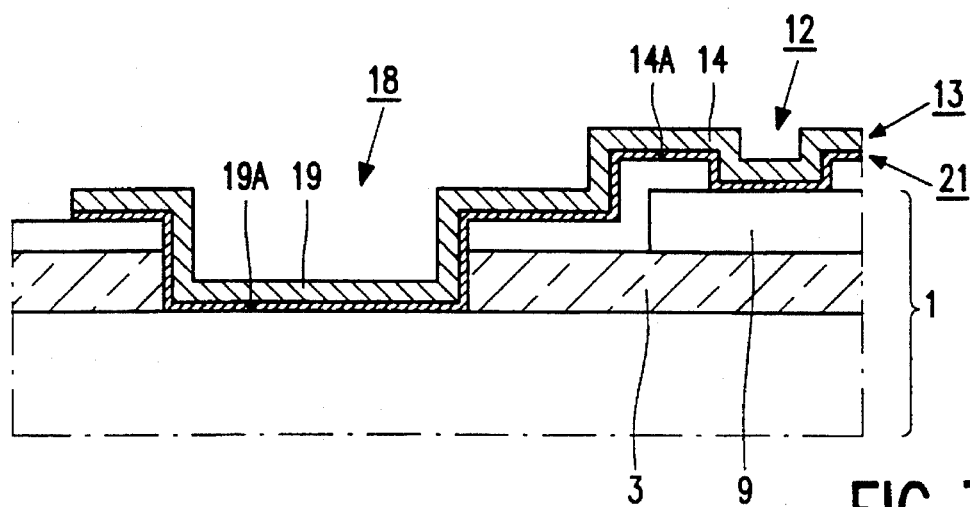

FIG. 7 shows a stage in a preferred embodiment of the method in which the conductive layer 13 is deposited on a conductive base layer 21, after which the conductor tracks 14, $14^A$ and the conductive elements 19, $19^A$ are formed both in the conductive layer 13 (14 and 19) and in the base layer ($14^A$ and $19^A$). The materials of the base layer 21 and the conductive layer 13 may then be chosen such that the conductive layer 13 is adequately protected by the base layer 21 during the process of exposing the insulating layer 3, and in addition the conductor tracks 14 have a comparatively low electrical resistance. In the example given here, titanium, tungsten, or a titanium-tungsten alloy is chosen as the material for the base layer 21. The silicon oxide insulating layer 3 is exposed in an etching bath with KOH. The conductive layer 13 is effectively protected by the base layer 21 in this etching bath. Aluminium or an aluminium alloy is chosen as the material for the conductive layer 13. As a result, the conductor tracks 14 have an electrical resistance which is much lower than that of conductor tracks formed in a titanium, tungsten, or titanium-tungsten alloy layer.

Figure 8:
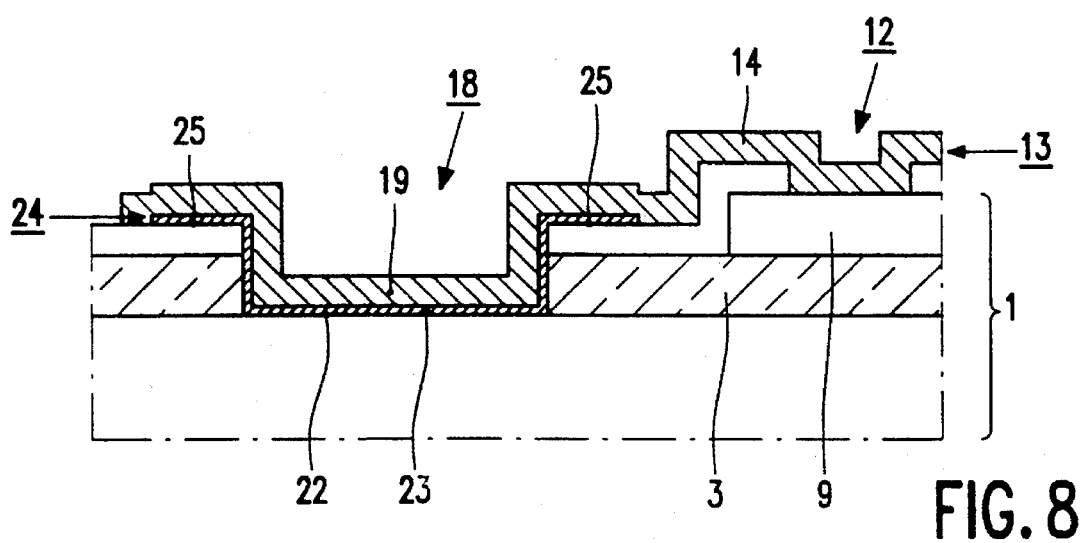

FIG. 8 shows a stage in a preferred embodiment of the method in which the contact windows 18 are provided with an auxiliary layer 23 on their bottom 22 before the conductive layer 13 is deposited. This is done in that an auxiliary layer 24 is deposited on the insulating layer 11 and in the contact windows 12 and 18, which auxiliary layer is subsequently covered with a photoresist mask (not shown) which covers the window 18 and an edge 15 surrounding this window. Then an etching treatment is carried out whereby the uncovered portions of the auxiliary layer are removed. Thus the auxiliary layer 23 remains on the bottom 22 of the contact windows 18. After the bottom 22 has been covered with the auxiliary layer 23, the conductive layer 13 is deposited in which subsequently the conductor tracks 14 and the conductive elements 19 are formed.

During the process of exposing the insulating layer 3, the conductive layer 13 is protected by the auxiliary layer 23. In the example depicted in FIG. 8, the material of the auxiliary layer 23 and that of the conductive layer 13 may be chosen fully independently of one another; the material of the auxiliary layer such that it is effectively resistant to the KOH etching bath, the material of the conductive layer 13 such that the conductor tracks 14 will have a low electrical resistance and will make a good contact with the semiconductor elements. In the example given here, an auxiliary layer 23 may be made of titanium, tungsten, or a titanium-tungsten alloy, and the conductive layer 13 may be made from aluminium or an aluminium alloy. An auxiliary layer with a thickness of approximately 10 nm in this case affords the conductive elements 19 an adequate protection.

Figure 10:
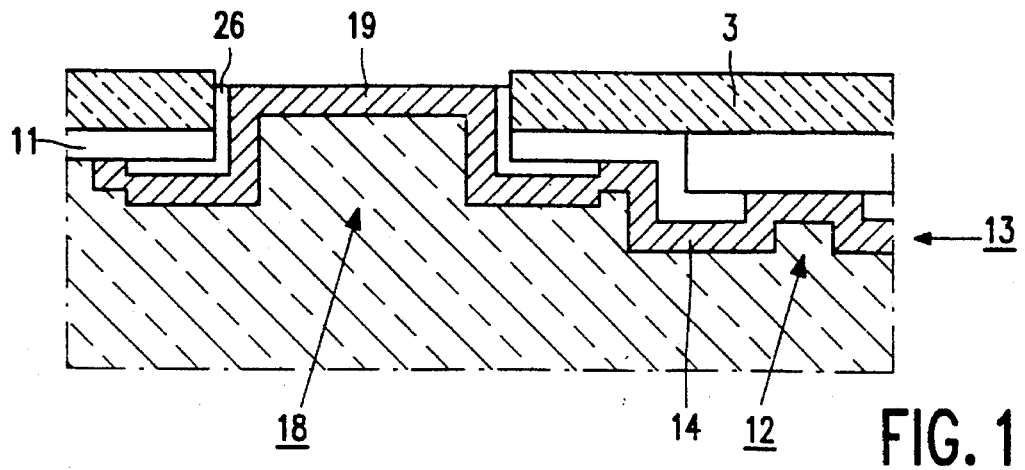
Figure 9:
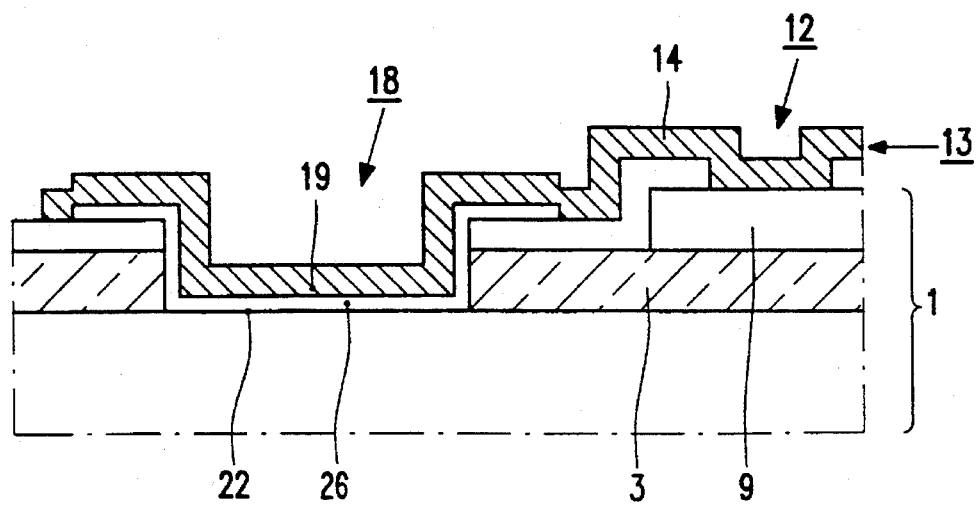

FIG. 9 shows a stage in a preferred embodiment of the method in which the auxiliary layer 26 is made from a non-conductive material, for example, an approximately 20 nm thick silicon nitride layer in this example which is very effective as an etching stopper during etching in an etching bath containing KOH. During or after the exposure of the insulating layer 3, as is shown in FIG. 10, the conductive elements 19 within the contact windows 18 are then also exposed. This may be done in a simple manner in that an etching treatment is carried out in a usual $CF_4$—$O_2$ plasma after the insulating layer of silicon oxide 3 has been exposed in the KOH etching bath.

The conductive elements 19 may alternatively be advantageously exposed when the auxiliary layer 23 is made of a conductive material, as in the example shown in FIG. 8, or when the conductive elements 19 are formed on a conductive base layer $19^A$, as in the example shown in FIG. 7. It is then possible in these cases to manufacture the conductive layer 13 from a material, such as aluminium or an aluminium alloy, on which a conductive wire 20 can be provided for external contacting by means of a usual bonding technique.

We claim:

1. A method of manufacturing semiconductor devices whereby semiconductor elements and conductor tracks are formed on a first side of a semiconductor slice comprising a layer of semiconductor material lying on an insulating layer, after which the semiconductor slice is fastened with this first side to a support slice, and after which material is removed from the semiconductor slice from the other, second side until the insulating layer has been exposed, during which method the insulating layer is provided with contact windows in which conductive elements are provided which are connected to the semiconductor elements, characterized in that the insulating layer is provided with contact windows and the conductive elements are provided in the contact windows from the first side of the semiconductor slice before the latter is fastened to the support slice.

2. A method as claimed in claim 1, characterized in that after the formation of the contact windows in the insulating layer a conductive layer is deposited on the first side of the semiconductor slice, in which subsequently both the conductor tracks and the conductive elements are formed by patterning the conductive layer.

3. A method as claimed in claim 2, characterized in that the layer of conductive material is deposited on a conductive base layer after which the conductor tracks and the conductive elements are formed by patterning both the conductive layer and the base layer.

4. A method as claimed in claim 2, characterized in that the contact windows are provided with an auxiliary layer on their bottom before the conductive layer is deposited.

5. A method as claimed in claim 4, characterized in that, after the insulating layer has been exposed, the conductive layer inside the contact windows is also exposed.

6. A method as claimed in claim 3, characterized in that, after the insulating layer has been exposed, the conductive layer inside the contact windows is also exposed.

* * * * *